United States Patent [19]

Takemoto

[11] 4,055,885
[45] Nov. 1, 1977

[54] CHARGE TRANSFER SEMICONDUCTOR DEVICE WITH ELECTRODES SEPARATED BY OXIDE REGION THEREBETWEEN AND METHOD FOR FABRICATING THE SAME

[75] Inventor: Iwao Takemoto, Kodaira, Japan

[73] Assignee: Hitachi, Ltd., Japan

[21] Appl. No.: 722,111

[22] Filed: Sept. 10, 1976

Related U.S. Application Data

[62] Division of Ser. No. 446,805, Feb. 28, 1974, abandoned.

[30] Foreign Application Priority Data

Feb. 28, 1973 Japan .................................. 48-23161
June 27, 1973 Japan .................................. 48-71713

[51] Int. Cl.² .................... B01J 17/00; H01L 29/58
[52] U.S. Cl. ........................................ 29/578; 357/24
[58] Field of Search .................... 29/578; 427/88–91; 357/24

[56] References Cited

U.S. PATENT DOCUMENTS 3,438,121  4/1969  Warlass et al. ..................... 29/578

Primary Examiner—Gerald A. Dost
Attorney, Agent, or Firm—Craig & Antonelli

[57] ABSTRACT

A charge transfer semiconductor device is made of a semiconductor body on one surface of which is formed an insulating layer of $SiO_2$. A plurality of first series of electrodes of Al are disposed on the $SiO_2$ layer and oxide regions ($Al_2O_3$) of the first series of electrodes are disposed on side surfaces of the first series of electrodes, which are formed by oxidizing the side surfaces of the first series of electrodes. A plurality of second series of electrodes is provided, each of which is disposed between a pair of the first series of electrodes so as to be separated from the first series of electrodes by the oxide region. Finally, means are connected to the electrodes for forming spatially defined depletion regions in the surface of the semiconductor body beneath the electrodes and for transferring charges between the depletion regions.

19 Claims, 30 Drawing Figures

CHARGE TRANSFER SEMICONDUCTOR DEVICE WITH ELECTRODES SEPARATED BY OXIDE REGION THEREBETWEEN AND METHOD FOR FABRICATING THE SAME

This is a division of application Ser. No. 446,805 filed Feb. 28, 1974 now abandoned.

FIELD OF THE INVENTION

This invention relates to charge transfer semiconductor devices and a method for fabricating the same and, more particularly, to a charge transfer semiconductor device with electrodes having narrow gaps therebetween and a method for making the same.

DESCRIPTION OF THE PRIOR ART

It is well known in the art that Bucket Brigade Devices, which are described in the IEEE Journal Solid-State Circuits, SC-4, pp. 131–136 (June, 1969), "Bucket Brigade Electronics — New Possibilities for Delay, Time-Axis Conversion and Scanning" by F. L. J. Sangster and K. Teer, Charge Coupled Semiconductor Devices, described in The Bell System Technical Journal, Volume 49, No. 4 pp. 587–593 (April, 1970), "Charge Coupled Semiconductor Devices" by W. S. Boyle and G. E. Smith, and Bulk Charge Semiconductor Devices described in Electronics Letters, Volume 8, pp. 620–621 (December, 1972), "Peristaltic Charge-Coupled Device: A New Type of Charge-Transfer Device", by L. J. M. Esser, may be utilized as to charge transfer semiconductor devices.

Throughout this specification, a charge coupled semiconductor device will be mainly described, since it is a general form of charge transfer semiconductor device; however, the present invention is not limited to charge coupled semiconductor devices, but is applicable to all types of charge transfer semiconductor devices.

A conventional charge coupled semiconductor device is a device having conventional Metal-Insulator-Semiconductor structure, which comprises a semiconductor body, an insulating layer disposed on one surface of the semiconductor body, means for introducing charge carriers within the semiconductor body, electrodes disposed separately on the insulating layer for storing charge carriers and for transferring charge carriers along the surface of the semiconductor body adjacent the insulating layer, means for applying an electric field to the semiconductor body, connected to the electrodes, and means for detecting transferred charge carriers.

This type of charge coupled semiconductor device is operated as follows.

A direct voltage is applied to one of the electrodes, so that a depletion region is formed in the surface of the semiconductor body adjacent the insulating layer beneath the electrode. Since this depletion region is formed only in the surface of the semiconductor body beneath the electrode applied with the direct voltage, a potential well is formed at that portion.

At this state, when charge carriers are introduced into the surface of the semiconductor body by means of, for example, the application of a forward voltage to a PN junction in the device, the inducement of an avalanche phenomenon in the Metal-Oxide-Semiconductor structure, or irradiation of radiant rays or light, charge carriers are stored in the potential well.

A direct voltage having a higher voltage than the direct voltage applied to the electrode is applied to another electrode adjacent the electrode. That is, a deeper potential well, compared with the potential well formed in the surface of the semiconductor body beneath the electrode, is formed in the surface of the semiconductor body beneath the adjacent electrode.

Since carriers in the shallow potential well shift to the deep potential well, the charge carriers are transferred to the portion of the surface of the semiconductor body beneath the adjacent electrode. After transferring the charge carriers to the portion in the semiconductor body beneath the adjacent electrode, the direct voltage applied to the electrode is cut off and the direct voltage applied to the adjacent electrode is reduced to the same voltage as that applied to the electrode. As a result the charge carriers are completely transferred to the portion in the surface of the semiconductor body beneath the adjacent electrode.

When the application of the direct voltages, as described above, is repeated between electrodes successively, the charge carriers are transferred along the electrodes in the surface of the semiconductor body adjacent to the insulating layer.

A principle and a fundamental structure of a charge coupled semiconductor device is described in detail in the aforementioned article of The Bell System Technical Journal, Volume 49, No. 4, pp. 587–593 (April, 1970), "Charge Coupled Semiconductor Devices," by W. S. Boyle and G. E. Smith.

As described above, in charge coupled semiconductor devices, the depletion region must be formed in the surface of the semiconductor body beneath the electrodes and between the electrodes for transferring the charge carriers.

In the surface of the semiconductor body beneath the electrodes, the depletion region is easily formed. However, in the surface of the semiconductor body between the electrodes, it is difficult to form a depletion region efficiently. That is, since, at the portions between the electrodes, there are no electrodes, there is no means for forming the depletion region.

Actually, the depletion region is spread along the surface of the semiconductor body between the electrodes by means of a fringing effect of the direct voltage applied to the electrodes. The spread of the depletion region along the surface of the semiconductor body has a length about the same as a depth of the depletion region perpendicular to the surface formed by the applied voltage. For example, when the N-type semiconductor body having a resistivity of about 10Ω-cm is utilized the length of the depletion region perpendicular to the surface of the semiconductor body is about 1.4μ, and the spread of the depletion region along the surface of the semiconductor body is about 1.4μ from the end of the electrode. Therefore, to form the depletion region in the surface of the semiconductor body between the electrodes, the gaps between the electrodes must be within about 2.8μ, that is, twice the spread of the depletion region.

That is, when the gap between the electrodes is more than twice the length of the depletion region, formation of the depletion region under the portion between the electrodes becomes difficult and, therefore, it becomes difficult to transfer the charge carriers through the surface of the semiconductor body between the electrodes. Therefore, the gap of the electrodes should be narrow, such as within 3μ.

Furthermore, even when the gap between the electrodes is formed narrowly as described above, a potential barrier is formed between the electrodes, because the effect of the applied voltages to the electrodes is weak between the electrodes.

Therefore, some minority carriers cannot be transferred due to the potential barrier.

For eliminating this disadvantage, there has been proposed a new type of charge coupled semiconductor device having another plurality of electrodes, each of which is disposed on another insulating layer which is disposed on the insulating layer between said electrodes of the aforementioned charge coupled semiconductor device and on a portion of the electrode.

However, this new type charge coupled semiconductor device has a disadvantage such that the density of integration cannot be increased, since, formation of the gap between the electrodes uniformly and accurately is very difficult, and a portion of each of the other electrodes and the portion of each of the electrodes should overlap each other with the other insulating layer therebetween.

As described above, in conventional charge coupled semiconductor devices, there are some disadvantages such that the gap between the electrodes should be narrow, the transferring efficiency of the minority carriers becomes low, the amount of nonuniformity of the gaps of the electrodes becomes high, and the integration density of the device becomes low.

BRIEF SUMMARY OF THE INVENTION

An object of the present invention, therefore, is to provide a charge coupled semiconductor device avoiding the above-mentioned disadvantages.

Another object of the present invention is to provide a charge coupled semiconductor device having a high transferring efficiency of the charge carriers.

A further object of the present invention is to provide a method for fabricating a charge coupled semiconductor device avoiding the above-mentioned disadvantages and having a high transferring efficiency of the charge carriers.

The objects of the present invention are accomplished by oxidizing first series of electrodes, whereby oxide regions are formed on sides of said first series of electrodes, which face each other, and by disposing a second series of electrodes, so that each of the second series of electrodes is positioned between the oxide regions.

Additional objects and advantages of the present invention will become apparent from the following description when taken in conjunction with accompanying drawings.

DETAILED DESCRIPTION OF THE INVENTION

In order to understand the present invention sufficiently, a further brief description of the prior art will be made first with reference to the dawings.

As described above, a charge transfer semiconductor device has electrodes on the surface of a semiconductor body through an insulating layer.

Figure 1:
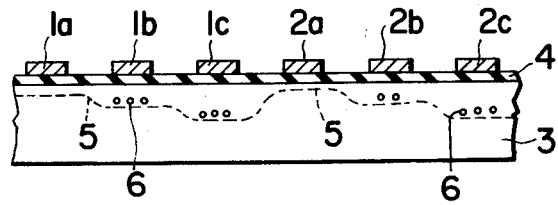
FIGS. 1 and 2 show cross-sectional views of the main parts of conventional charge coupled semiconductor devices.

The structure of a main part of a conventional charge coupled semiconductor device is shown in FIG. 1, wherein electrodes 1a, 1b, 1c, 2a, 2b, 2c formed of a metal or a semiconductor are disposed on a monocrystalline semiconductor body 3, such as silicon with an insulating layer 4, such as silicon dioxide, therebetween.

For the purposes of explanation, it is assumed that the semiconductor body 3 is an N-type semiconductor material, and the principles of operation and the explanation described hereinbelow is also applicable to the case that the semiconductor material is of P-type, by reversing the potential relationships.

The principle of the operation of the charge coupled semiconductor device described above will be explained with reference to FIG. 1.

It is assumed that the peak values of pulse voltages applied to electrodes 1a, 2a; 1b, 2b; and 1c, 2c are $-V_1$; $-V_2$; and $-V_3$, respectively. Where, among these peak values, the relation of $V_1 < V_2 < V_3$, is effected. the surface potential region of the semiconductor body 3 is as shown by the dotted line 5 in FIG. 1, which depends on the values of voltages applied to the electrodes 1a, 1b, 1c, 2a, 2b, 2c and on a thickness of the insulating layer 4.

Beneath the surface potential 5 as shown in FIG. 1, positive holes 6 beneath the electrodes 1b and 2b move toward portions beneath the electrodes 1c and 2c, respectively, since the potentials of the electrodes 1c and 2c are lower than those of the electrodes 1b and 2b. Then, when the relationship among the peak values of the pulse voltages is changed to the relationships $V_2 < V_3 < V_1$, in a quite similar manner, positive holes beneath the electrodes 1c and 2c moves toward the portions beneath the electrode 2a and the electrode next to the electrode 2c, respectively.

Based upon this principle, positive holes are caused to be transferred.

This conventional charge coupled semiconductor device, however, has disadvantages which will be explained with reference to FIG. 2.

Figure 2:
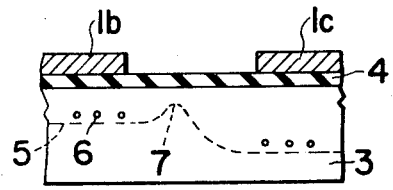

FIG. 2 is an enlarged view of one portion in FIG. 1, that is, it shows a gap between electrodes 1b and 1c, for example.

The surface potentials of the semiconductor body 3 beneath the electrodes 1b and 1c are determined by the potential of the body 3 (it is hereinafter assumed that the body is at ground potential) and the voltages applied to the electrodes 1b and 1c.

Also, the surface potential of the body 3 in the gap between both electrodes 1b and 1c, in other words, the surface potential of the body 3 which does not have an electrode just thereabove is determined by the potentials of both electrodes 1b and 1c and the potential of the body 3. However, the effect of the potential by the electrode depends on the distance from the electrode and the greater the distance, the greater reduction in the effect.

Therefore, the surface potential curves which are spread from the electrodes 1b and 1c cross each other at a cross-over point 7. In other words, a certain point (the cross-over point 7) of the semiconductor body 3 between the electrodes 1b and 1c undergoes a greater effect by the potential of the opposite side of the body 3 than by both the electrodes 1b and 1c and the surface potential at the cross-over point 7 becomes higher than the surface potential of the body 3 just beneath the electrodes. Therefore, this cross-over point 7 acts as a potential barrier for the holes 6.

This potential barrier tends to be generated and becomes larger as charges are transferred, that is, the difference between surface potentials in the body just beneath the electrodes 1b and 1c becomes small, or the length of the gap between electrodes 1b and 1c becomes long. Therefore, since a portion of holes in the body 3 beneath the electrode 1b cannot be transferred to the portion in the surface of the body 3 beneath the electrode 1c and, hence, the transferring efficiency of holes is decreased, this potential barrier is a significant obstacle to the transit of charges in charge transfer semiconductor devices.

In order to decrease the influence of the potential barrier, it is necessary to decrease the distance of the gap between electrodes. It is however, difficult to decrease the distance less than $3\mu$ by present day processing techniques utilizing a photolithographic etching.

Figure 3:
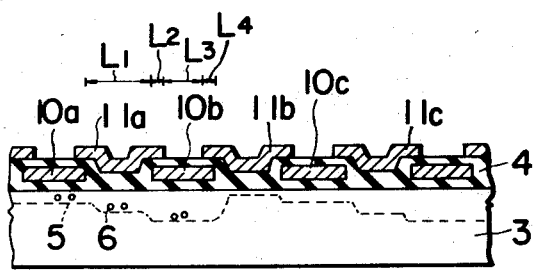
FIG. 3 shows a cross-sectional view of the main part of another conventional charge coupled semiconductor device.

For eliminating the potential barrier, a charge coupled semiconductor device shown in FIG. 3 has been proposed. In this device, the potential barriers between electrodes 10a and 10b, and 10b and 10c are removed by providing other electrodes 11a and 11b at the gaps between electrodes 10a and 10b, and 10b and 10c, respectively, and by applying negative voltages to the other electrodes 11a and 11b.

However, the charge coupled semiconductor device shown in FIG. 3, wherein other electrodes 11a, 11b are disposed at the gaps between electrodes 10a and 10 b, and 10b and 10c for removing the potential barriers still has the following disadvantages.

In the fabrication of the charge coupled semiconductor device shown in FIG. 3, problems arise during the formation of the two layers of electrodes, since the spaces $L_1$ and $L_3$ between the electrodes 10a and 10b, and between the electrodes 11a and 11b, respectively, and the spaces $L_2$ and $L_4$ are necessary for superimposing the electrodes 11a and 10b, and the electrodes 11b and 10b, respectively. Even if each of these spaces $L_1$, $L_2$, $L_3$ and $L_4$ is selected to be $3\mu$, which is the limit of processing accuracy at present, at least $9\mu$ is required for the length of the electrode 10b and thus at least $12\mu$ is required for a set of electrodes, that is, for example, electrodes 11a and 10b and 10c.

This fact that the length of the electrode becomes longer when compared with the length to be provided according to present day processing accuracy, that is $3\mu$, causes such disadvantages that it is difficult to fabricate a charge coupled semiconductor device having a high integration density, and also the transferring speed of charge carriers becomes low since the speed is inversely proportional to two powers of the length of the electrode.

These disadvantages result in the necessity of overlapping electrodes during processing.

Figure 4:
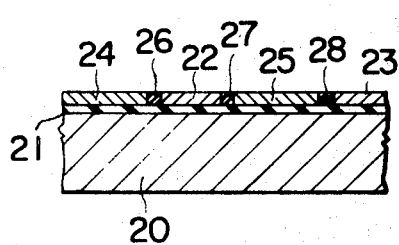
FIG. 4 shows a cross-sectional view of a main part of one embodiment of the present invention.
Figure 5:
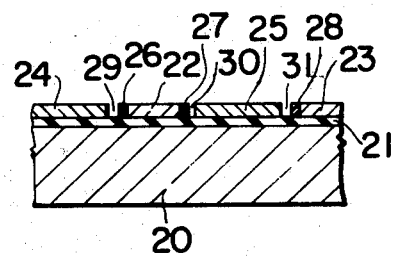
FIG. 5 shows a cross-sectional view of a main part of another embodiment of the present invention.

The above-mentioned disadvantages of the conventional charge transfer semiconductor devices are removed by the present invention shown in FIGS. 4 and 5.

In FIG. 4, on an insulating layer 21 disposed on a semiconductor body 20, a first series of electrodes 22, 23 are disposed, and a second series of electrodes 24, 25 are disposed on said insulating layer 21, each of which is located between one pair of said first series of electrodes so as to be separated by one of oxidized regions 26, 27, 28 of material of the first series of electrodes 22, 23.

In FIG. 5, air gaps 29, 30, 31 are disposed so as to separate each of oxidized regions 26, 27, 28 from each electrode of the second series of electrodes 24, 25 in FIG. 4.

The fabrication of the charge transfer semiconductor device shown in FIG. 4 will be explained with reference to FIGS. 6a–6e.

Figure 6A:
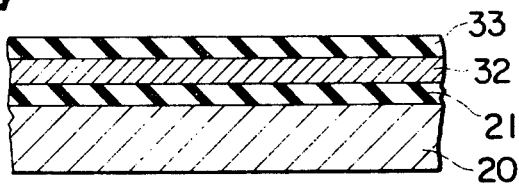
FIGS. 6a-6e are cross-sectional views for explaining the fabrication of one embodiment shown in FIG. 4.

An N-type silicon (Si) body 20 having a specific resistance of 10 Ω cm is heated in an oxidizing atmosphere containing oxygen at 1100° C to form an insulating layer 21 of $SiO_2$ having a thickness of 1000 A, a metal layer 32 of aluminum (Al) is formed on said insulating layer 21 so as to have a thickness of about 5000 A, and a photo-resist 33 such as AZ 1350 (trade name of photo-resist obtainable from Shipley Co.) is applied onto metal layer 32, so as to have a thickness of about 5000 A (FIG. 6a).

Figure 6B:
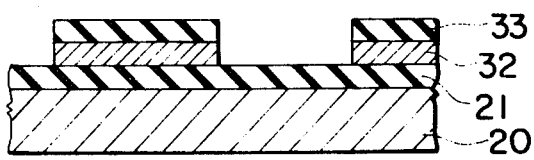

Then, in the process of the normal photolithographic etching, photo-resist 33 is etched in accordance with a predetermined electrode pattern, and metal layer 32 is etched according to the pattern (FIG. 6b).

Figure 6C:
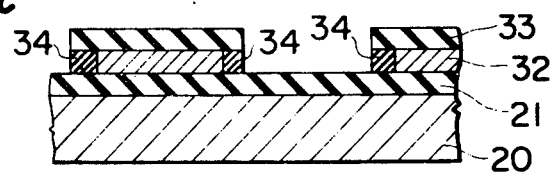

The exposed surfaces of the metal layer 32, that is the side surfaces of the metal layer 32 are oxidized in an anodic oxidization process to form oxidized regions 34 of about 2000 A in thickness into the layer 32 (FIG. 6c).

Figure 6D:
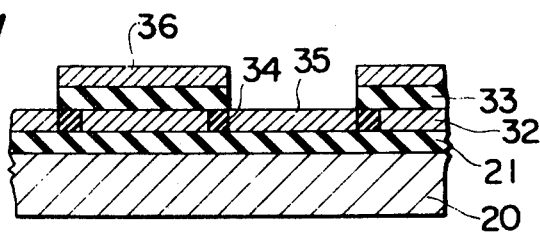

Afterwards, onto the resultant member, aluminum (Al) is evaporated on the order of 5000 A in thickness and, hence, conductive layers 36 are formed on the photo-resist 33 and conductive layers 35 are formed on the insulating layer 31 so as to be separated from the metal layers 32 by the oxidized regions 34 (FIG. 6d).

Figure 6E:
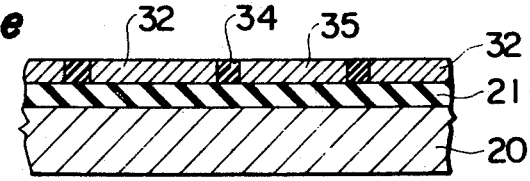

Then, the photo-resist 33 is removed by a usual removing process together with the conductive layers 36, whereby the conductive layers 35 are formed so as to be separated from the metal layers 32 by the oxidized regions 34 (FIG. 6e).

In this charge transfer semiconductor device, there are no potential barriers, since the gap between each of the metal layer 32 and each of conductive layers 35 is about 2000 A, that is, the thickness or width of the oxidized region is practically equal to zero with respect to a field effect.

Moreover, since the width of each metal layer 32 and each of conductive layers 35 can be about $3\mu$, which is the limit of the processing accuracy, the integration density of the charge transfer device becomes high.

In other words, when the electrodes are formed with a processing accuracy of $3\mu$, for example, a charge transfer semiconductor device having an electrode gap of the order of 2000 A and an electrode width of 3μ is obtained.

The conductive layer 36 may remain with the photo-resist 33, and may be used for objects completely different from the electrodes of charge transfer semiconductor devices, such as wirings.

Moreover, when utilizing conductive layers 36 for the different objects, silicon dioxide layers may be utilized instead of the photo-resist 33, and to make the devices more stable.

FIGS. 7a-7e are explanatory views for fabricating the charge transfer semiconductor device shown in FIG. 5.

Figure 7A:
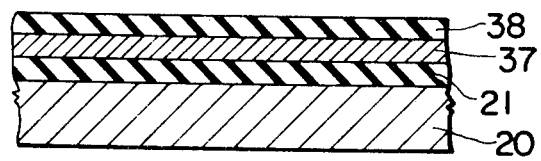
FIGS. 7a-7f are cross-sectional views for explaining a fabrication of another embodiment shown in FIG. 5.
Figure 7B:
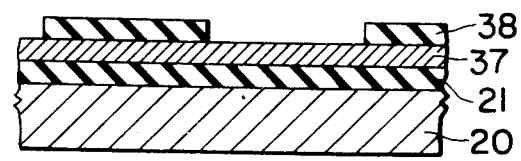

An N-type silicon (Si) body 20 having a specific resistance of 10 Ω cm is heated in an oxidizing atmosphere containing oxygen at 1000° C to form an insulating layer 21 of SiO₂ having a thickness of about 1000 A. A silicon layer doped with boron 37 of about 5000 A in thickness is formed on insulating layer 21 by a process of thermal decomposition of SiH₄ at a temperature of about 900° C and a process of thermal diffusion of boron into the silicon layer formed by the thermal decomposition process, and on the silicon layer 37, a photoresist layer 38 is deposited (FIG. 7a). The silicon layer 37 may be formed by introducing B₂H₆ during the process of forming the silicon layer.

Figure 7C:
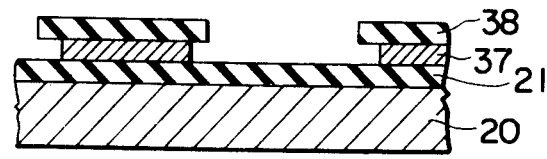

Then, photo-resist layer 38 is etched by a conventional photolithographic etching in a predetermined electrode pattern (FIG. 7b), and the silicon layer 37 is etched utilizing the photo-resist layer 38 as an etching mask. At this time, as shown in FIG. 7c, the etching is excessively effected beneath the photo-resist layer on the order of 3000 A.

Figure 7D:
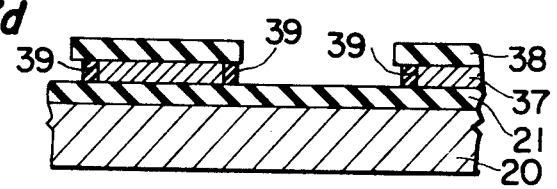

Next, exposed surfaces of said silicon layer 37 are oxidized in an anodic oxidization process to form oxidized regions 39 of about 2000 A in thickness (FIG. 7d).

Figure 7E:
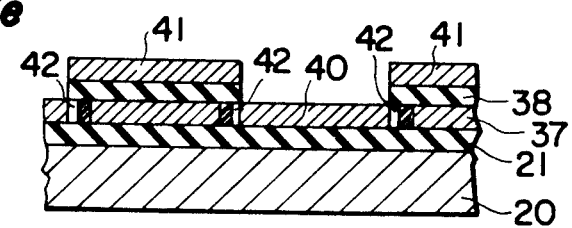

Afterwards, onto the resultant member, gold (Au) is evaporated on the order of 5000 A in thickness and, hence, conductive layers 41 are formed on the photo-resist layer 38 and conductive layers 40 are formed on the insulating layer 21 so as to be separated from the silicon layer 37 by the oxidized regions 39 and air gaps 42 (FIG. 7e).

When the conductive layers 41 are removed with the photo-resist layers 38, the charge transfer semiconductor device shown in FIG. 5 is obtained.

The conductive layers 41 may remain with the photo-resist layers 38, and may be utilized for objects completely different from electrodes for charge transfer semiconductor devices.

Figure 7F:
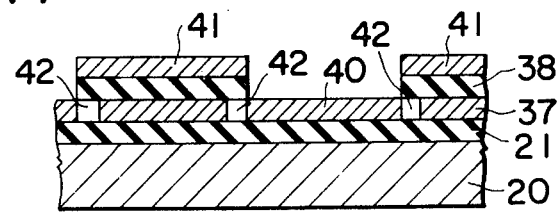

Though the electrode gap in the charge transfer semiconductor device shown in FIG. 5 comprises an air gap and an oxidized region, an air gap only may be used. This device is fabricated by substituting the step illustrated in FIG. 7f for the steps of FIGS. 7d and 7e.

Figure 8A:
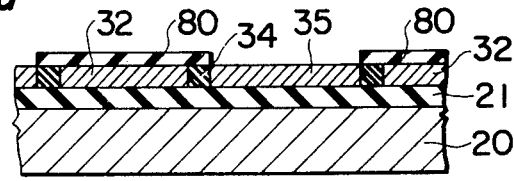
FIGS. 8a-8b are cross-sectional views of a main part of a further embodiment of the present invention.

FIG. 8a shows a cross-sectional view of a main part of a further embodiment of the present invention.

This device is similar to the device shown in FIG. 6e except that an insulating layer 80 of SiO₂ is disposed on the metal layer 32 and the oxide region 34.

This device becomes extremely stable, since the effect of the migration of the conductive layers 35, which increases when the conductive layers are of Al or Au, is completely eliminated.

Figure 8B:
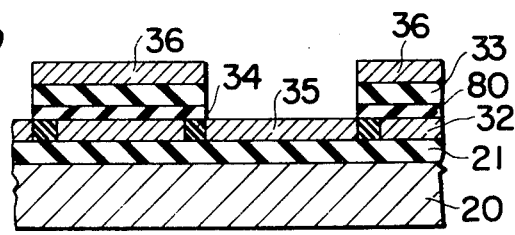

This device shown in FIG. 8a is fabricated by steps similar to those for fabricating the device shown in FIG. 6e except for a further step of forming SiO₂ layer 80 on the metal layer 32 prior to the formation of the photo-resist layer 33. A figure similar to FIG. 6d is shown in FIG. 8b.

When the metal layers 32 are utilized as the first series of electrodes, contacts for connecting outer voltage supplying means should be fabricated by making holes through the SiO₂ layers 80, to expose the main surfaces of the metal layers 32 and making conductive materials on the exposed surfaces.

Figure 9:
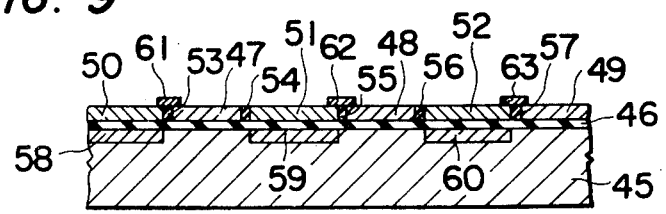
FIG. 9 shows a cross-sectional view of the main part of a further embodiment of the present invention.

Though the charge transfer semiconductor devices described above can be utilized for charge transfer semiconductor devices, wherein charge carriers are transferred by three or two phase shift pulses, a more suitable charge transfer semiconductor device utilizing two phase shift pulses is shown in FIG. 9.

In FIG. 9, a first series of electrodes 47, 48, 49 is disposed on an insulating layer 46 disposed on a semiconductor body 45. A second series of electrodes 50, 51, 52 is disposed on insulating layer 46, each of which is located between one pair of the first series of electrodes so as to be separated by one of the oxidized regions 53, 54, 55, 56, 57 of material of the first series of electrodes 47, 48, 49. Semiconductor regions 58, 59, 60 the conductivity type of which is the same as the impurity concentration of which is higher than those of semiconductor body 45, are disposed in body 45 just beneath the second series of electrodes 50, 51, 52 and conductors 61, 62, 63 are disposed so as to connect each pair of the first and second series of electrodes.

The fabrication of the charge transfer semiconductor device shown in FIG. 9 will be explained with reference to FIGS. 10a through 10f.

Figure 10A:
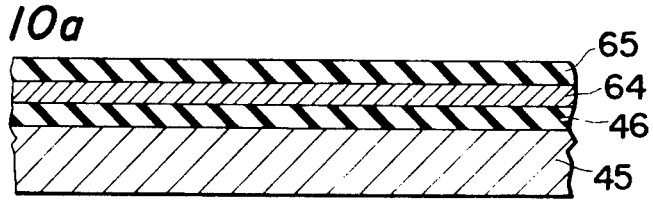
FIGS. 10a-10e are cross-sectional views for explaining a method of a fabrication of the embodiment shown in FIG. 9.

A P-type silicon (Si) body 45 having a specific resistance of 10 Ω cm is heated in a dry oxygen at a temperature of about 1000° C for forming an insulating layer 46 of SiO₂ having a thickness of 1000 A. A polycrystalline silicon layer 64 doped with phosphorus is formed on insulating layer 46, and a phospho-silicate glass layer 65 is formed on polycrystalline silicon layer 64 (FIG. 10a).

Figure 10B:
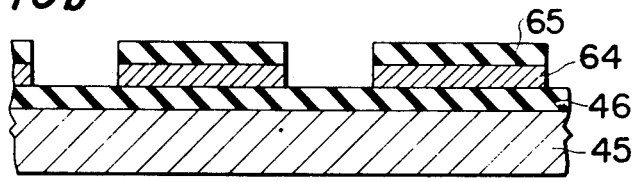

Then, phospho-silicate glass layer 65 and said polycrystalline silicon layer 64 are etched according to a predetermined electrode pattern (FIG. 10b).

Figure 10C:
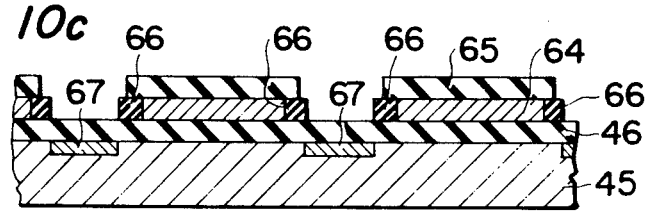

The exposed surfaces of the polycrystalline silicon layer 64 are oxidized in an anodic oxidation process to form oxidized regions 66 of about 3000 A in thickness, and semiconductor regions 67 are formed in semiconductor body 45 by implanting boron ions with an implantation energy of about 100 KeV (FIG. 10c).

Figure 10D:
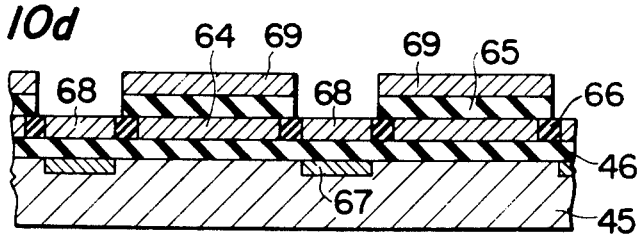

Afterwards, aluminum layers 68 and 69 are formed by depositing aluminum on insulating layers 68 and phospho-silicate glass layers 65, respectively (FIG. 10d).

Figure 10E:
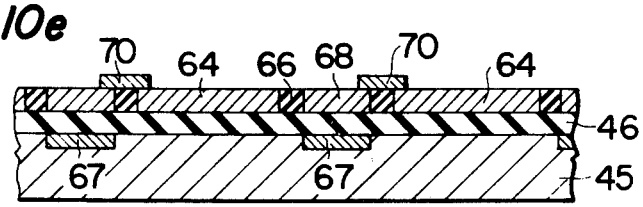

Then, phospho-silicate glass layers 65 are removed with aluminum layers 69, and conductive layers 70 are formed, as shown in FIG. 10e, whereby the charge transfer semiconductor device shown in FIG. 9 is fabricated.

FIGS. 11a through 11f show another method for fabricating a charge transfer semiconductor device having an electrode gap consisting of an air gap and an oxidized region of a material of an electrode.

Figure 11A:
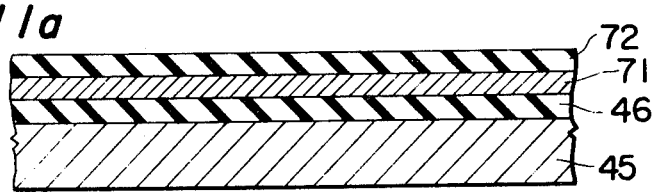
FIGS. 11a-11f are cross-sectional views for explaining a method of a fabrication of a still further embodiment of the present invention.

A P-type silicon body 45 having a specfic resistance of 10 Ω cm is heated in a dry oxygen at a temperature of 1100° C for forming an insulating layer 46 of SiO₂ having a thickness of 1300 A. An aluminum layer 71 is formed on insulating layer 46, and photo-resist 72 is formed on aluminum layer 71 (FIG. 11a).

Figure 11B:
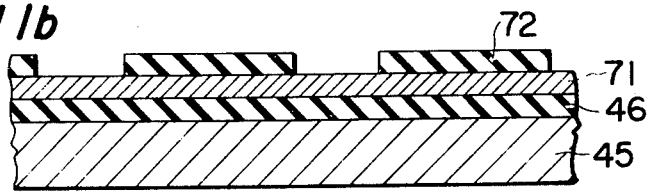

The photo-resist 72 is etched according to a predetermined electrode pattern by a normal photolithographic etching process (FIG. 11b).

Figure 11C:
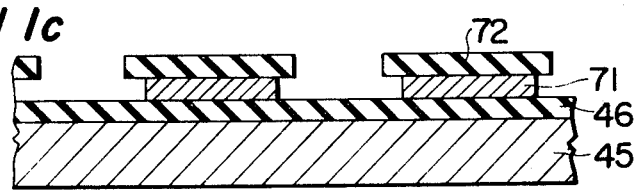

Then, aluminum layer 71 is etched by a conventional photolithographic etching utilizing the etched photo-resist 72 as an etching mask. At this time, as shown in FIG. 11c, the etching is excessively effected beneath the photo-resist 72 on the order of 5000 A.

Figure 11D:
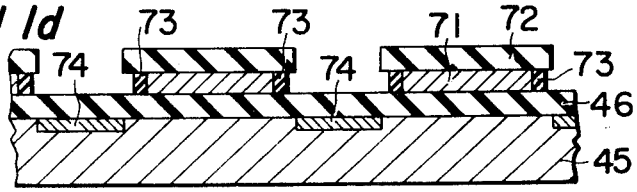

Next, exposed surfaces of etched aluminum layers 71 are oxidized in an anodic oxidization process to form oxidized regions 73 of about 2000 A in thickness, and semiconductor regions 74 are formed by implanting boron ions into the semiconductor body 45 at an implantation energy of about 100 KeV (FIG. 11d).

Figure 11E:
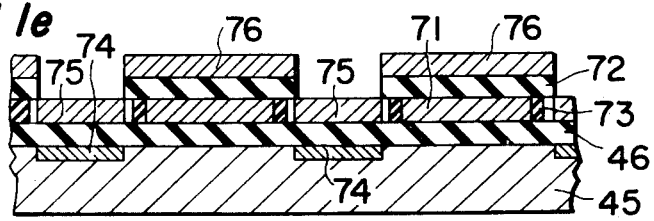
Figure 11F:
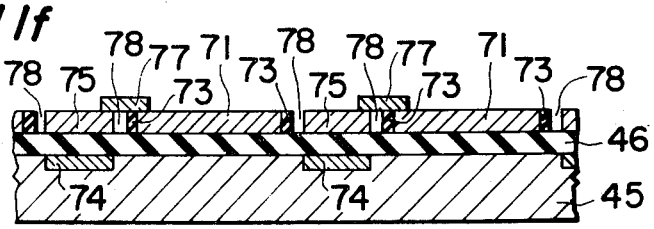

Afterwards, onto the resultant member, aluminum is evaporated on the order of 5000 A in thickness, whereby conductive layers 75 are formed on insulating layer 46 and conductive layers 76 are formed on the photo-resist 72 (FIG. 11e).

When the photo-resist 72 is removed with the conductive layers 76, and conductive layers 77 are disposed so as to connect one of conductive regions 75 and one of the aluminum layers 71, as shown in FIG. 10f, the charge transfer semiconductor device having the electrode gap consisting of the air gap 78 and th oxidized region 73 of the electrode 71 is fabricated.

In the above embodiments, the electrode gap, that is, the oxide region and/or air gap is between 2000 A and 5000 A in width, but the width of the gap is not limited to this value; it may be in the range of value of 100 A 1μ, preferably 200 A–5000 A. Where the gap is much less than 200 A, particularly less than 100 A, an electrode and an adjacent electrode would be short-circuited, and thus each electrode does not operate correctly. Where the gap is more than 5000 A, particularly 1μ, it becomes more difficult to perfectly eliminate the potential barrier between electrodes.

While aluminum, polycrystalline silicon and gold are utilized as the first and second series of electrodes, they may be the same material or different conductive materials, for example, metals such as tantalum, tungsten and molybdenum. Particularly, as the second series of electrodes, conductive oxides such as stannic oxide ($SnO_2$) and indium oxide ($InO_2$) may be utilized.

Also, materials acting as the mask for making first series of electrodes are not limited to the photo-resist of AZ 1350 obtainable from Shipley Co., the phospho-silicate glass and the silicon dioxide layer but other various resist materials such as KTFR, KMER obtainable from Kodak Co. and materials from which materials of the electrode are quite different in chemical solubility, for example, material such as $Al_2O_3$ or $Si_3N_4$ or even conductive materials such as aluminum with regard to the electrode of tantalum or stannic oxide may be utilized.

Moreover, the oxidization method of the first series of electrodes is not limited to anodic oxidization, but thermal oxidization and chemical oxidation may be utilized.

Although silicon dioxide is utilized as the insulating layer directly disposed on the surface of the semiconductor body, other insulating materials, such as $Al_2O_3$, $Si_3N_4$ or composite layers of those materials may be utilized.

While the invention has been explained in detail, it is to be understood that the technical scope of the invention is not limited to that of the foregoing embodiments but applicable to all charge transfer semiconductor devices as stated in the claims.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. A method of manufacturing a charge transfer semiconductor device comprising the steps of:
    a. forming a first insulating layer on a first surface of a semiconductor body;
    b. forming a first conductive layer on said first insulating layer;
    c. forming a masking layer on said first conductive layer;
    d. selectively removing portions of said first conductive layer and said masking layer, to expose a plurality of surface portions of said first insulating layer and side surfaces of said first conductive layer;
    e. replacing selected portions of said first conductive layer disposed beneath peripheral portions of said masking layer with a second insulating layer; and
    f. selectively forming a second conductive layer on said plurality of exposed surface portions of said first insulating layer.

2. A method of manufacturing a charge transfer semiconductor device according to claim 1, wherein step (d) comprises the step of selectively etching said first conductive layer and said masking layer in accordance with a predetermined pattern.

3. A method of manufacturing a charge transfer semiconductor device according to claim 1, wherein step (e) comprises converting exposed side surface portions of said first conductive layer into said second insulating layer by oxidizing said exposed side surface portions of said first conductive layer.

4. A method of manufacturing a charge transfer semiconductor device according to claim 3, wherein step (f) comprises forming said second conductive layer to be contiguous with the oxidized side surface portion of said first conductive layer.

5. A method of manufacturing a charge transfer semiconductor device according to claim 1, wherein step (f) further includes the step of forming said second conductive layer on the surface of said masking layer.

6. A method of manufacturing a charge transfer semiconductor device according to claim 3, wherein said step of oxidizing comprises the step of thermally oxidizing said first conductive layer.

7. A method of manufacturing a charge transfer semiconductor device according to claim 3, wherein said step of oxidizing comprises the step of chemically oxidizing said first conductive layer.

8. A method of manufacturing a charge transfer semiconductor device according to claim 3, wherein step (f) comprises the step of subjecting the side surface portions of said first conductive layer to anodic oxidation.

9. A method of manufacturing a charge transfer semiconductor device according to claim 2, wherein step (e) comprises selectively etching side surface portions of said first conductive layer beneath said masking layer, and then oxidizing the etched side surface portions of said first conductive layer so that said second insulating layer extends only partially toward the peripheral edge of said masking layer, thereby leaving a gap therebeneath.

10. A method of manufacturing a charge transfer semiconductor device according to claim 4, wherein said masking layer comprises a first oxide layer disposed directly on said first conductive layer and a second layer of masking material disposed directly on said first oxide layer.

11. A method of manufacturing a charge transfer semiconductor device according to claim 10, further comprising the step of (g) removing said second layer of masking material from said first oxide layer.

12. A method of manufacturing a charge transfer semiconductor device according to claim 4, further comprising the steps of (g) removing said masking layer and (h) selectively forming a third conductive layer on said second insulating layer at portions thereof between alternate pairs of said first and second conductive layers so as to bridge said first and second conductive layers thereat.

13. A method of manufacturing a charge transfer semiconductor device according to claim 4, wherein the oxidation step is carried out so that oxide material extends outwardly from the peripheral edge portions of said masking layer.

14. A method of manufacturing a charge transfer semiconductor device according to claim 13, further comprising the step of introducing impurities of a prescribed conductivity type into the exposed surface portions of said semiconductor body prior to the formation of said second conductive layer.

15. A method of manufacturing a charge transfer semiconductor device according to claim 14, further comprising the steps of (g) removing said masking layer and (h) selectively forming a third conductive layer on said second insulating layer at portions thereof between alternate pairs of said first and second conductive layers so as to bridge said first and second conductive layers thereat.

16. A method of manufacturing a charge transfer semiconductor device according to claim 9, further comprising the step of introducing impurities of a prescribed conductivity type into the exposed surface portions of said semiconductor body prior to the formation of said second conductive layer.

17. A method of manufacturing a charge transfer semiconductor device according to claim 16, further comprising the steps of (g) removing said masking layer and (h) selectively forming a third conductive layer on said second insulating layer at portions thereof between alternate pairs of said first and second conductive layers so as to bridge said first and second conductive layers thereat.

18. A method of manufacturing a charge transfer semiconductor device according to claim 9, wherein step (f) comprises the step of forming said second conductive layer to be aligned with the edge of said masking layer, thereby leaving said gap between said second insulating layer and said second conductive layer.

19. A method of manufacturing a charge transfer semiconductor device comprising the steps of:

a. forming a first insulating layer on a first surface of a semiconductor body;

b. forming a first conductive layer on said first insulating layer;

c. forming a masking layer on said first conductive layer;

d. selectively removing portions of said first conductive layer and said masking layer, to expose a plurality of surface portions of said first insulating layer and side surfaces of said first conductive layer which are disposed inwardly from the peripheral edge portion of said masking layer, thereby leaving a gap therebeneath; and e. selectively forming a second conductive layer on said plurality of exposed surface portions of said first insulating layer, so that said first and second insulating layers are separated from each other by the gaps beneath peripheral edge portions of said masking layer.

* * * * *